(12) United States Patent
Clinton (10) Patent No.: US 12,183,429 B2
(45) Date of Patent: Dec. 31, 2024

(54) TURBO MODE SRAM FOR HIGH PERFORMANCE

(71) Applicant: Taiwan Semiconductor Manufacturing Company Limited, Hsinchu (TW)

(72) Inventor: Michael Clinton, Austin, TX (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/848,599

(22) Filed: Jun. 24, 2022

(65) Prior Publication Data

US 2022/0328082 A1     Oct. 13, 2022

Related U.S. Application Data

(63) Continuation of application No. 16/139,779, filed on Sep. 24, 2018, now Pat. No. 11,393,514.

(60) Provisional application No. 62/562,541, filed on Sep. 25, 2017.

(51) Int. Cl.
| | |
|---|---|
| *G11C 7/22* | (2006.01) |
| *G11C 5/14* | (2006.01) |
| *G11C 7/08* | (2006.01) |
| *G11C 7/12* | (2006.01) |
| *G11C 8/08* | (2006.01) |
| *G11C 11/419* | (2006.01) |
| *H10B 10/00* | (2023.01) |

(52) U.S. Cl.
CPC .............. *G11C 7/227* (2013.01); *G11C 5/145* (2013.01); *G11C 7/08* (2013.01); *G11C 7/12* (2013.01); *G11C 8/08* (2013.01); *G11C 11/419* (2013.01); *H10B 10/00* (2023.02)

(58) Field of Classification Search
CPC ........... G11C 7/227; G11C 5/145; G11C 7/08; G11C 7/12; G11C 8/08; G11C 11/419; H10B 10/00
See application file for complete search history.

(56) References Cited

U.S. PATENT DOCUMENTS

| | | | |
|---|---|---|---|
| 2005/0035796 A1* | 2/2005 | Chun ............... | H03K 3/356008 327/143 |
| 2011/0032751 A1* | 2/2011 | Funane ..................... | G11C 8/16 365/156 |
| 2013/0194860 A1* | 8/2013 | Cheng .................... | G11C 7/227 365/189.011 |

(Continued)

*Primary Examiner* — Uyen Smet
(74) *Attorney, Agent, or Firm* — Jones Day (57) ABSTRACT

Systems, devices, and methods are provided for enabling turbo mode for static random access memory (SRAM) devices. A cell circuit is coupled between a bit line pair and configured to perform read or write operations of a memory device. A sense amplifier circuit is coupled between the bit line pair and configured to sense a voltage differential between the bit line pair. A tracking circuit includes a tracking bit line (DBL) and is configured to monitor operation of the cell circuit and send a sense amplifier enable signal to the sense amplifier at a predetermined frequency rate based on a voltage level of the DBL. A turbo circuit is coupled to a turbo signal and configured to modify the voltage of the tracking bit line enabling sending of the sense amplifier enable signal at a rate faster than the predetermined frequency rate.

20 Claims, 12 Drawing Sheets

(56) References Cited

U.S. PATENT DOCUMENTS

2013/0250659 A1* 9/2013 Kawasumi ............ G11C 11/419
365/226
2014/0010032 A1* 1/2014 Seshadri ................ G11C 7/227
365/230.06

* cited by examiner

TURBO MODE SRAM FOR HIGH PERFORMANCE

PRIORITY CLAIM

The present application is a continuation of U.S. patent application Ser. No. 16/139,779, filed Sep. 24, 2018, which claims priority to U.S. Application No. 62/562,541, filed Sep. 25, 2017, the content of which are incorporated by reference herein in their entirety.

FIELD

The technology described in this disclosure relates generally to electronic devices and more particularly to static random access memory (SRAM) devices.

BACKGROUND

Memory devices are widely used for electronic applications where high speed and low power consumption are desired. Static random access memory (SRAM) are an example memory device. SRAM devices are typically made up of SRAM cells implemented using transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
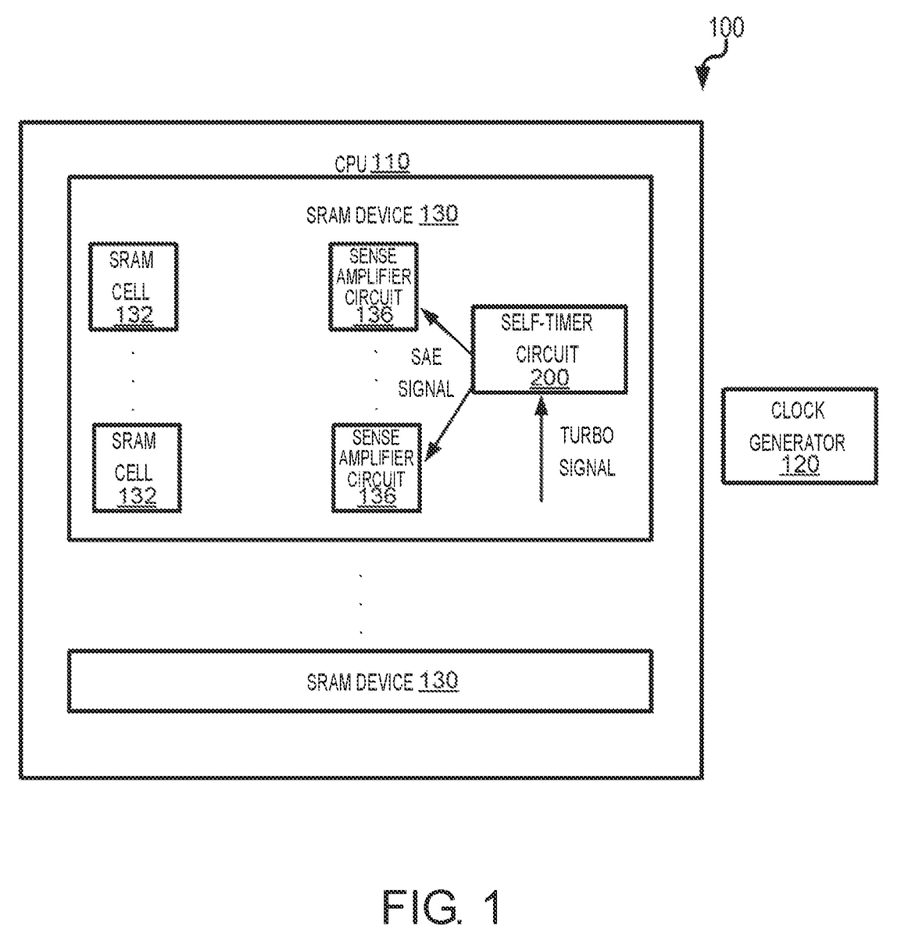
FIG. 1 depicts an example system on a chip (SoC) in accordance with some embodiments.

FIG. 1 depicts an example system on a chip (SoC) 100 in accordance with some embodiments. SoC 100 includes a central processing unit (CPU) 110 and a clock generator 120. CPU 110 contains one or more SRAM devices 130. SRAM device 130 includes an array of SRAM cells 132, one or more sense amplifier circuits 136, and a self-timer circuit 200, along with various latches, decoders, and control circuits (not shown). A SRAM cell 132 can include different numbers of transistors (e.g., nMOS transistors and/or pMOS transistors). In accordance with one embodiment, for example, a SRAM cell 132 contains six transistors. Clock generator 120 specifies frequency rates at which CPU 110 (e.g., SRAM cell 132 and self-timer circuit 200) operates. With the various embodiments described herein, SRAM device 130 can be enabled to operate in "turbo mode." Turbo mode allows the frequency of clock generator 120 to be higher than its nominal operation, which in turn enables SRAM device 130 to perform read and/or write operations at a higher frequency. With turbo mode, clock generator 120 can increase a global clock period and enable SRAM device 130 to operate at a higher frequency level (e.g., SRAM device 130 performs read and/or write operations at a speed faster than when self-timer circuit 200 is absent from SRAM device 130). A turbo signal initiates turbo mode. When in turbo mode, self-timer circuit 200 generates a Sense Amplifier Enable (SAE) signal which controls the operational speed of one or more sense amplifier circuits 136. The sense amplifier circuits 136 in turn increase the frequency at which data is read by SRAM cells 132. The SAE signal is generated based on a voltage differential between a pair of bit lines (BL/BLB), as described in more detail in FIG. 2.

Each SRAM cell 132 can include different numbers of transistors (e.g., nMOS transistors and/or pMOS transistors). The transistors can form a data latch for storing a data bit. Additional transistors may be added to control the access to the transistors. SRAM cells 132 can be arranged as an array having rows and columns. Typically, each row of the SRAM cells 132 is connected to a word-line (WL), which determines whether the current SRAM cell 132 is selected or not. Each column of the SRAM cells 132 is connected to a bit line (BL) or pair of BLs (BL/BLB), which is used for storing a data bit into a selected SRAM cell 132 or reading a stored data bit from the selected SRAM cell 132. The SRAM cells 132 can be spatially separated within an array on the SRAM device 130.

In accordance with some embodiments, each SRAM cell 132 is a 6-transistor circuit that includes a cross-coupled latch and at least two pass gates controlled by a WL. Each pass gate is connected to a BL/BLB pair. In some embodiments, SRAM device 130 can be a multiplexer (MUX) device (e.g., 1024×72 MUX4 having approximately 64,000 SRAM cells 132 configured as 256-rows by 288-columns).

The exact behavior of SRAM cells 132 (e.g., timing characteristics of those SRAM cells 110 for read and write operations) vary. Manufacturing variances and inefficiencies associated with electrical components themselves or interactions with other nearby components (e.g., leakage currents) can cause each SRAM cell 132 to behave differently. Placement of the SRAM cells 132 in the SRAM device 130 may also affect behavior based on signal travel times (e.g., based on an SRAM cell's location within the CPU 110 or data line lengths).

Each SRAM device 130 includes a self-timer circuit 200. Self-timer circuit 200 configurably speeds up or slows down the operation of its associated SRAM device 130 to account for varying operational capabilities of SRAM cells 132 in the array. In accordance with some embodiments, self-timer circuit 200 is used to generate internal timing of the operation of SRAM cells 132 based on voltage differential levels between a BL/BLB pair. The internal timing coordinates operations (e.g., signal arrival times at destinations) of SRAM device 130 and maximizes operating speed or other metrics of interest (e.g., power characteristics). The use of self-timer circuit 200 allows for more precise timing of operation of the SRAM cells 132 based on actual capability of the individually SRAM cells 132 rather than an externally applied, predetermined time delay (e.g., a static delay value that is assigned to SRAM cells 132 at position (N, M) in the array of the SRAM device 130 as a best guess for accounting for signal travel times based on the distance from (N, M) from signal originations or destinations) or based on the weakest bit of self-timer circuit 200 at a low voltage. A predetermined time delay cannot account for actual capabilities of the SRAM cells 132 and idiosyncrasies of the SRAM device 130, making such implementations suboptimal.

In order to operate the SRAM cells 132 in the array at its highest efficiency, "tracking" functionality exists within the SRAM device 130. With tracking, self-timer circuit 200 can simulate some electrical signals of one or more SRAM cells 132. Based on that simulation, which is informed by certain signal characteristics that self-timer circuit 200 is able to observe, self-timer circuit 200 can track or control aspects of the operational frequency rate at which SRAM cells 132 operate. Tracking functionality within self-timer circuit 200 enables determination of when a SRAM cell 132 completes a read or write operation. Tracking cells, as described in more detail in FIG. 3, emulate the SRAM array (e.g., of SRAM cells 132) of the SRAM device 130 during read or write operations. Based on that simulation, a time sequence control signal is generated (e.g., SAE enable explained in more detail in FIG. 3). Having insight into when a SRAM cell 132 completes a read or write operation provides for an estimation of the timing characteristics of the SRAM device 130 operation. For example, a write operation can take more time to complete than a read operation, the cycle time of the SRAM device 130 in this case would be dominated by the write operation. Tracking functionality can substantially eliminate or minimize the operational time of the SRAM device 130 to perform a read and/or write operation by monitoring the operational performance of a one or more cells 132 and increasing an operational frequency of one or more SRAM cells 132 of the SRAM device 130. Injection of a turbo signal into self-timer circuit 200 can modify voltage levels within self-timer circuit 200 causing one or more sense amplifier circuits 136 of SRAM device 130 to operate at a faster rate (e.g., enabling turbo mode). The operation of sense amplifier circuit 136 at a faster rate in turn enables SRAM device 130 to operate at a higher frequency.

Figure 2:
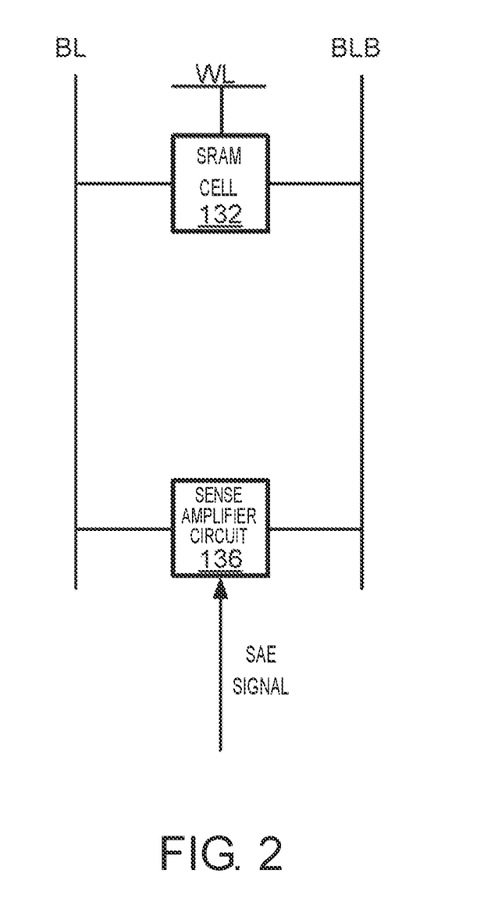
FIG. 2 depicts an example block diagram representation of interconnection between a SRAM cell and a sense amplifier circuit in accordance with some embodiments.

FIG. 2 depicts an example block diagram representation of interconnection between a SRAM cell 132 and sense amplifier circuit 136. SRAM cell 132 and sense amplifier circuit 136 can be coupled to a BL/BLB pair of SRAM device 130. SRAM cell 132 is also coupled to a WL. In accordance with some embodiments, the BL/BLB pair is precharged to a voltage supply level, $V_{DD}$. When the WL is activated (e.g., logic '1'), latch nodes of SRAM cell 132 (not shown) are connected to the BL/BLB pair through the WL, as controlled by pass gate transistors (e.g., nMOS transistors). Depending on which latch node of SRAM cell 132 stores the logic '0', one line of the BL/BLB pair starts to discharge, while the other remains at the precharged voltage level (e.g., $V_{DD}$). The discharge of one line (e.g., either BL or BLB), causes a voltage differential to exist between the BL/BLB pair. Sense amplifier circuit 136 requires a minimum voltage level to be enabled via SAE signal. With a minimum voltage level, sense amplifier circuit 136 amplifies the voltage differential between the BL/BLB pair to a full-swing signal. Turbo signal, as described in more detail in FIGS. 3-7, enables the SAE signal to be sent more quickly, enabling faster operation of sense amplifier circuit 136, and in turn enabling SRAM device 130 to operate at a higher frequency rate.

Figure 3:
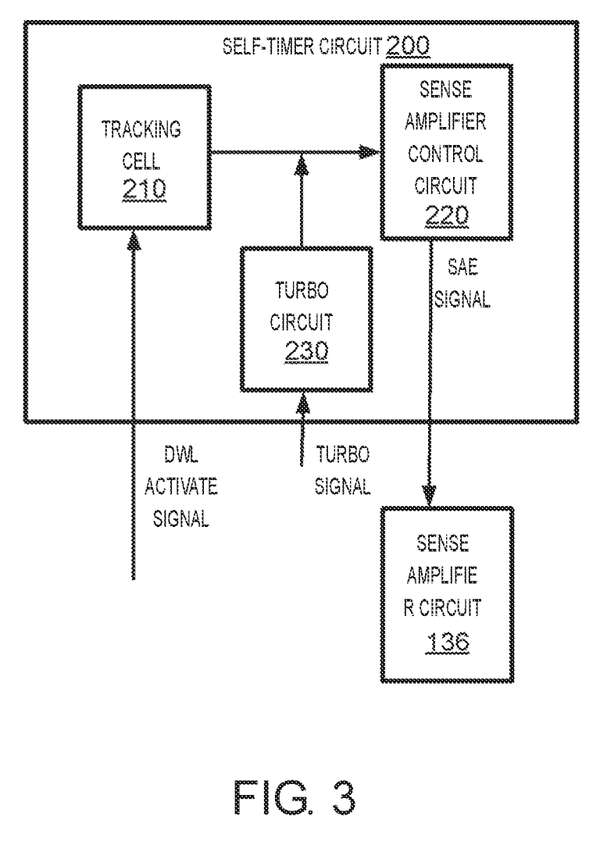
FIG. 3 depicts an example block diagram representation of a self-timer circuit in accordance with some embodiments.

FIG. 3 depicts an example block diagram representation of a self-timer circuit 200 in accordance with some embodiments. Self-timer circuit 200 includes a tracking cell 210, a sense amplifier control circuit 220, and a turbo circuit 230. Tracking cell 210 is a circuit used to track and/or imitate read and/or write signals at different locations within an array of SRAM cell 132. A tracking word line (DWL) activation signal enables operation of tracking cell 210. The tracking is performed by tracking cell 210. The electrical components within tracking cell 210 discharge during "tracking." Based on voltage levels of the tracking cell 210 dropping below a predetermined threshold level, sense amplifier control circuit 220 generates a sense amplifier enable (SAE) signal. The generated SAE signal activates sense amplifier circuit 136 (e.g., turns on sense amplifier circuit 136). When on, sense amplifier circuit 136 senses data from the "real" cells within an array of SRAM cells 132. Due to component inefficiencies of individual SRAM cells 132 within an array, the timing of the SAE signal can be delayed when it activates sense amplifier circuit 136, causing SRAM device 130 to operate at a lower operational frequency. The time delay of sending the SAE signal can be decreased by adding turbo circuit 230 to the self-timer circuit 200. A turbo signal can activate turbo circuit 230. With turbo circuit 230 activated, voltages of the tracking cell 210 can be modified which in turn speeds up when the SAE signal is sent, decreasing a time delay.

Figure 4:
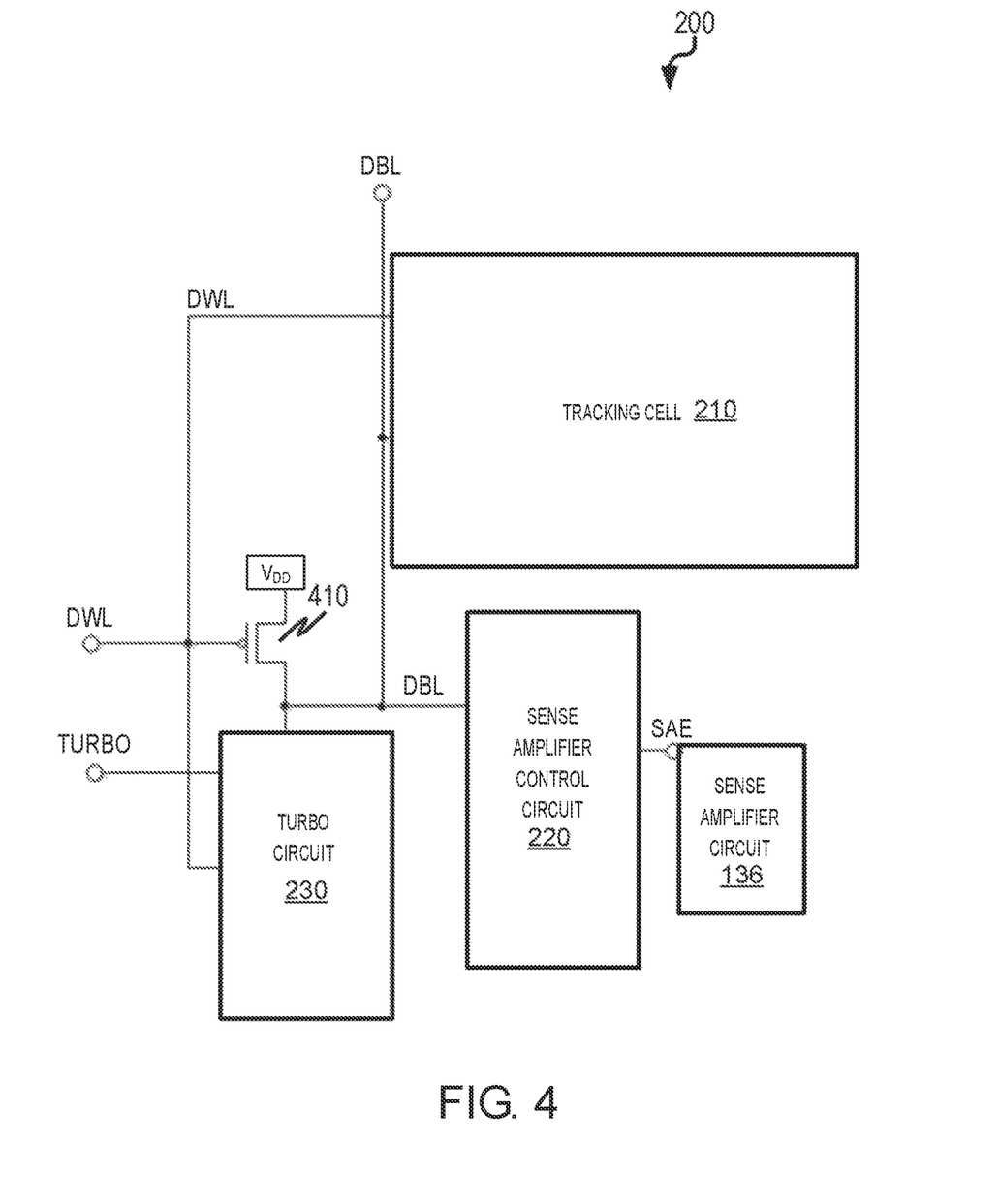
FIG. 4 depicts an example electrical block diagram of the self-timer circuit of FIGS. 1-2 in accordance with some embodiments.

FIG. 4 depicts an example electrical block diagram of the self-timer circuit 200 of FIG. 1 in accordance with some embodiments. A tracking word line (DWL) controls operation of one or more tracking cells 210 of a row or column or both. Tracking word line DWL is coupled to a gate of pMOS transistor 410. PMOS transistor 410 provides current to turbo circuit 230, as described in more detail in FIG. 6. A tracking bit line (DBL) determines when SAE sends a logic "1" to enable operation of sense amplifier circuits 136. DBL also couples SRAM cells 132 in a column of an array. Absent turbo circuit 230, DWL is activated during a time cycle driven by clock generator 120. With DWL activated, electrical components within tracking cell 210 are discharged, as described in more detail in FIG. 6. When the voltage level of DBL reaches a level that is below a predetermined threshold voltage, the SAE signal is generated by sense amplifier control circuit 220. The SAE signal activates operation of the electrical components within sense amplifier circuit 136. Sense amplifier circuit 136, when operating, will sense data from the "real" SRAM cells 132 of the SRAM device 130. A worst case time delay in SRAM device 130 can be determined by the weakest bit of tracking cell 210 at a low voltage. When the tracking cell 210 voltage is raised, the read current, $I_{CELL}$, difference between a nominal cell and the weak tracking cell 210 is reduced resulting in a high voltage differential of the SRAM device. One way to address this high voltage differential is to turn on one or more additional tracking cells 210 in order to speed up a discharge rate of DBL. Another way to address this high voltage differential is to couple turbo circuit 230 between the DWL and the DBL. A turbo signal can activate the electrical components within turbo circuit 230. When the turbo signal is asserted, turbo circuit 230 speeds up the timing of electrical discharge of the electrical components within tracking cell 210. The speed up can be accomplished with one embodiment illustrated in FIG. 6 or with an alternative embodiment illustrated in FIG. 7. With either embodiment, turbo circuit 230 reduces the time delay associated with tracking. The reduction in time delay increases the performance of the SRAM device 130 and decreases the voltage differential between the BL/BLB pair.

Figure 5:
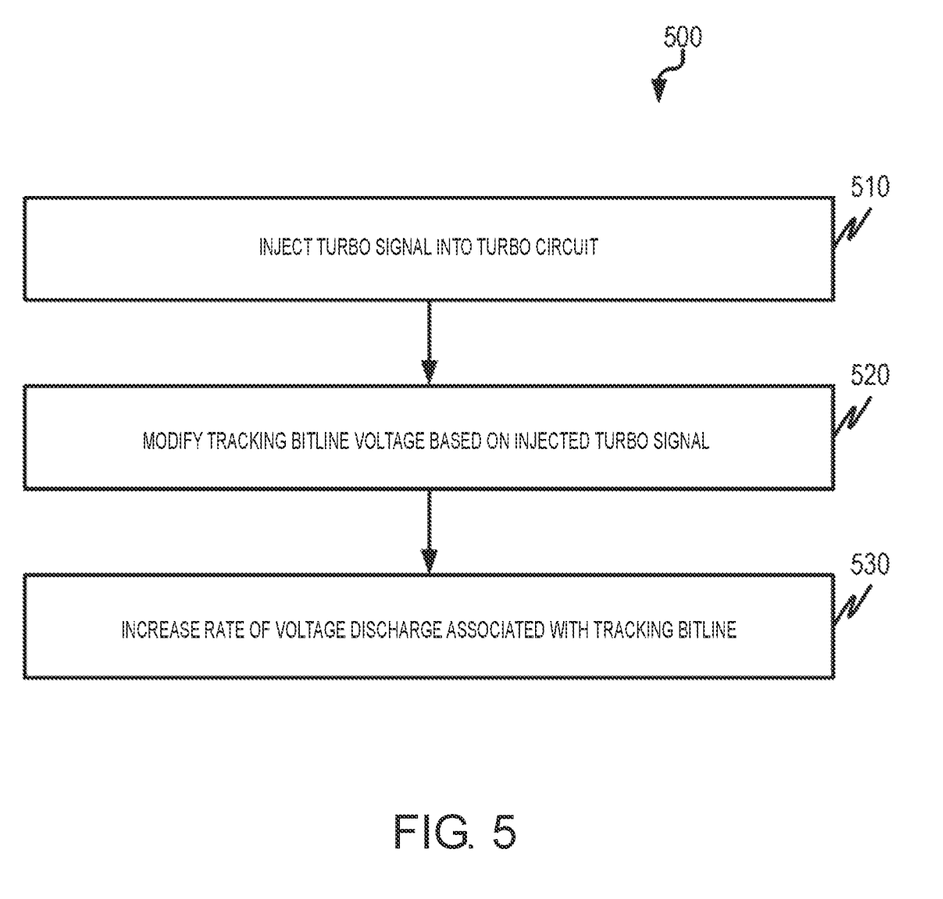
FIG. 5 depicts an example flow chart for enabling turbo mode of a self-timing circuit in accordance with some embodiments.

FIG. 5 depicts an example flow chart 500 for enabling turbo mode of a self-timing circuit 200 in accordance with some embodiments. While the process described in FIG. 5 is applicable to many different hardware configurations, the process is described with reference to structures from FIGS. 1-3 here for ease in understanding. A turbo signal can be injected, at 510, to turbo circuit 230. Turbo circuit 230 modifies the DBL voltage, at 520, based on the injected turbo signal as described in more detail in FIGS. 6-7. The modified DBL voltage can in turn speed up the rate at which the SAE signal is generated by sense amplifier control circuit 220 and activates sense amplifier circuit 136.

Figure 6:
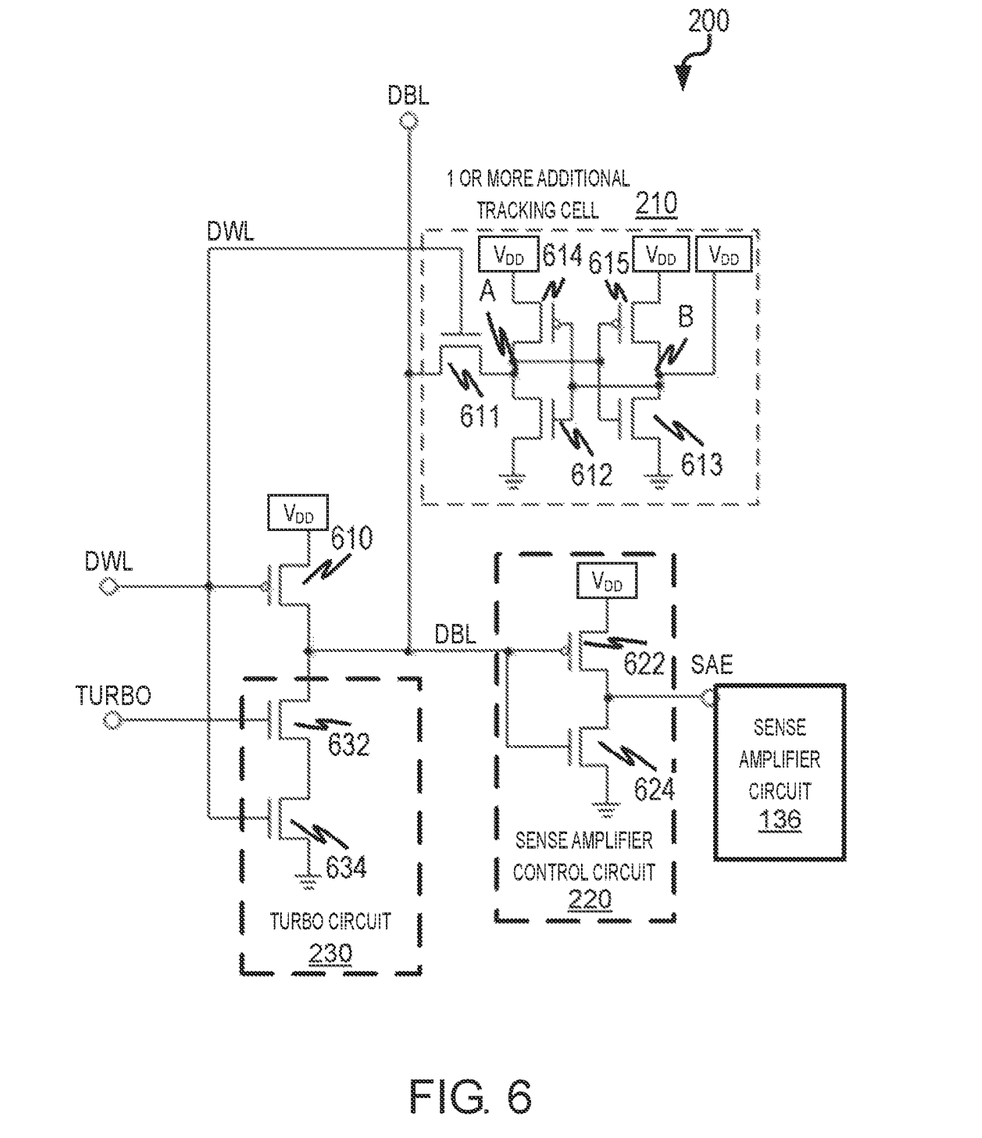
FIG. 6 depicts an example electrical schematic of self-timer circuit of FIGS. 1-3 in accordance with some embodiments.

FIG. 6 depicts an example electrical schematic of self-timer circuit 200 of FIGS. 1-4 in accordance with some embodiments. Tracking cell 210 includes nMOS transistors 611, 612, 613 and pMOS transistors 614, 615. Sense amplifier control circuit 220 includes pMOS transistor 622 and nMOS transistor 624.

Turbo circuit 230 is activated by a turbo signal. In some embodiments, turbo signal is a direct current (DC) voltage signal and can be asserted when the operational voltage, $V_{DD}$, is greater than a predetermined voltage threshold. When the turbo signal is asserted, the rate of voltage discharge of the electrical components of tracking cell 210 is increased. In one embodiment, as illustrated in FIG. 6, turbo circuit 230 includes nMOS transistors 632, 634. A source/drain terminal of nMOS transistor 632 is electrically coupled to DBL and a source/drain terminal of timer transistor 610 (e.g., pMOS transistor). The gate terminal of nMOS transistor 632 is electrically coupled to the turbo signal. Another source/drain terminal of nMOS transistor 632 is electrically coupled to a source/drain terminal of nMOS transistor 634. NMOS transistor 634 has a gate terminal electrically coupled to the DWL and another source/drain terminally electrically coupled to ground. With a turbo signal applied, nMOS transistor 632 is on. When on, nMOS transistors 632, 634 draw current which in turn lowers the DBL voltage level at a rate more quickly than if turbo circuit 230 was not present or if the applied turbo signal was low.

Tracking cell 210 reads the discharge of DBL. Node B is tied to the supply voltage $V_{DD}$, which in turn forces Node A to always be low. When DWL is off (e.g., logic '0'), transistor 610 being on precharges DBL to a voltage level of $V_{DD}$ at the source of transistor 610. When DWL is on (e.g., logic '1') and DBL has a voltage level of $V_{DD}$, nMOS transistor 611 is operational. An operational nMOS transistor 611 connects DBL to a discharge path to $V_{SS}$ through nMOS transistors 611 and 612. When DBL has precharged to $V_{DD}$, nMOS transistor 624 is on, holding the SAE signal at a voltage level of $V_{SS}$ at the source of transistor 624. When DBL is discharged, nMOS transistor 626 loses current which in turn eventually turns off nMOS transistor 624 and pMOS transistor 622 turns on. With pMOS transistor 622 having a source/drain terminal coupled to $V_{DD}$, SAE switches from $V_{SS}$ to $V_{DD}$. The high voltage of $V_{DD}$ activates the sense amplifier circuit 136.

Figure 7:
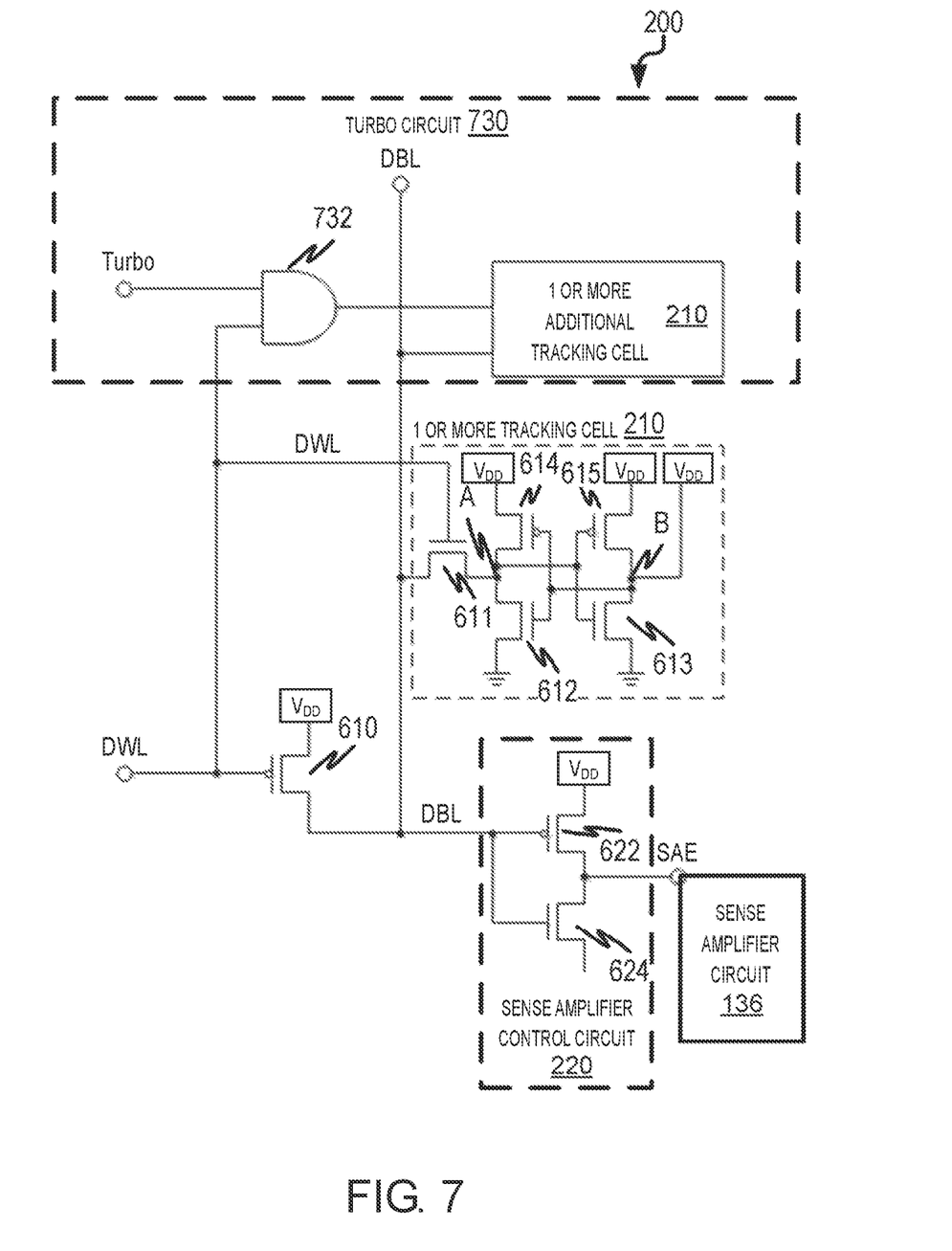
FIG. 7 depicts another example electrical schematic of self-timer circuit of FIGS. 1-3 in accordance with some embodiments.

FIG. 7 depicts another example electrical schematic of self-timer circuit 200 of FIGS. 1-4 in accordance with some embodiments. Turbo circuit 230, 730 can include, in accordance with some embodiments, a logic gate 732 (e.g., AND gate) and additional tracking cells 210. A turbo signal is coupled to an input of logic gate 732 and the DWL is coupled to another input of logic gate 732. When both the turbo signal and the DWL are high, additional tracking cells 210 can be enabled to operate. Additionally tracking cells 210 can be arranged in either a row or column. With additional tracking cells 210 operating, the DBL voltage level will decrease at a faster rate (e.g., rate of discharge on DBL will increase).

Figure 8:
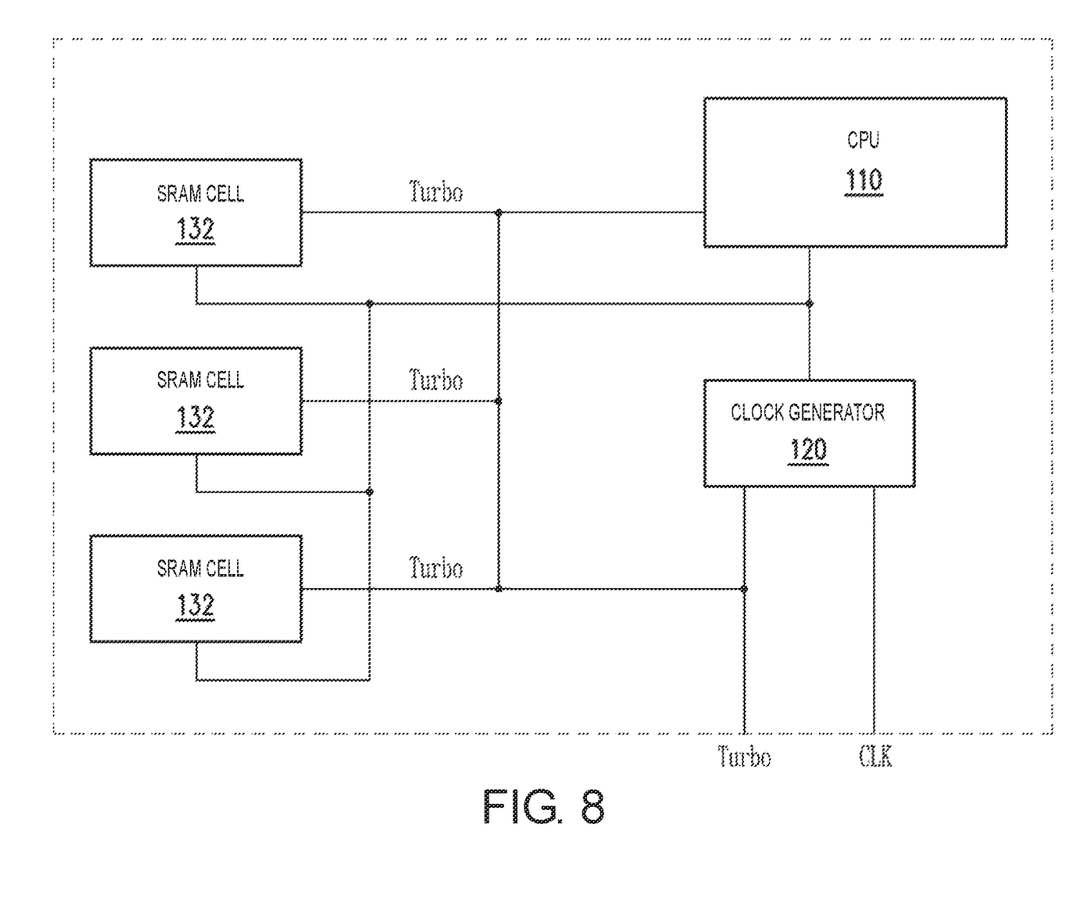
FIG. 8 depicts an example system architecture of SRAM device incorporating turbo mode at a system on chip (SoC) level in accordance with some embodiments.

FIG. 8 depicts an example system architecture incorporating turbo mode at a system on chip (SoC) level in accordance with some embodiments. A turbo signal can be provided as input to SRAM device 130 and delivered to each SRAM cell 132, CPU 110, and clock generator 120. For illustration purposes only, CPU 110 is illustrated as a separate entity from SRAM cells 132, however, CPU 110 contains SRAM cells 132 as described in detail in FIG. 1. The SoC level implementation as illustrated in FIG. 8 can be used in conjunction with the turbo circuit 230 embodiments discussed in FIGS. 3-4 and 6-7.

Figure 9:
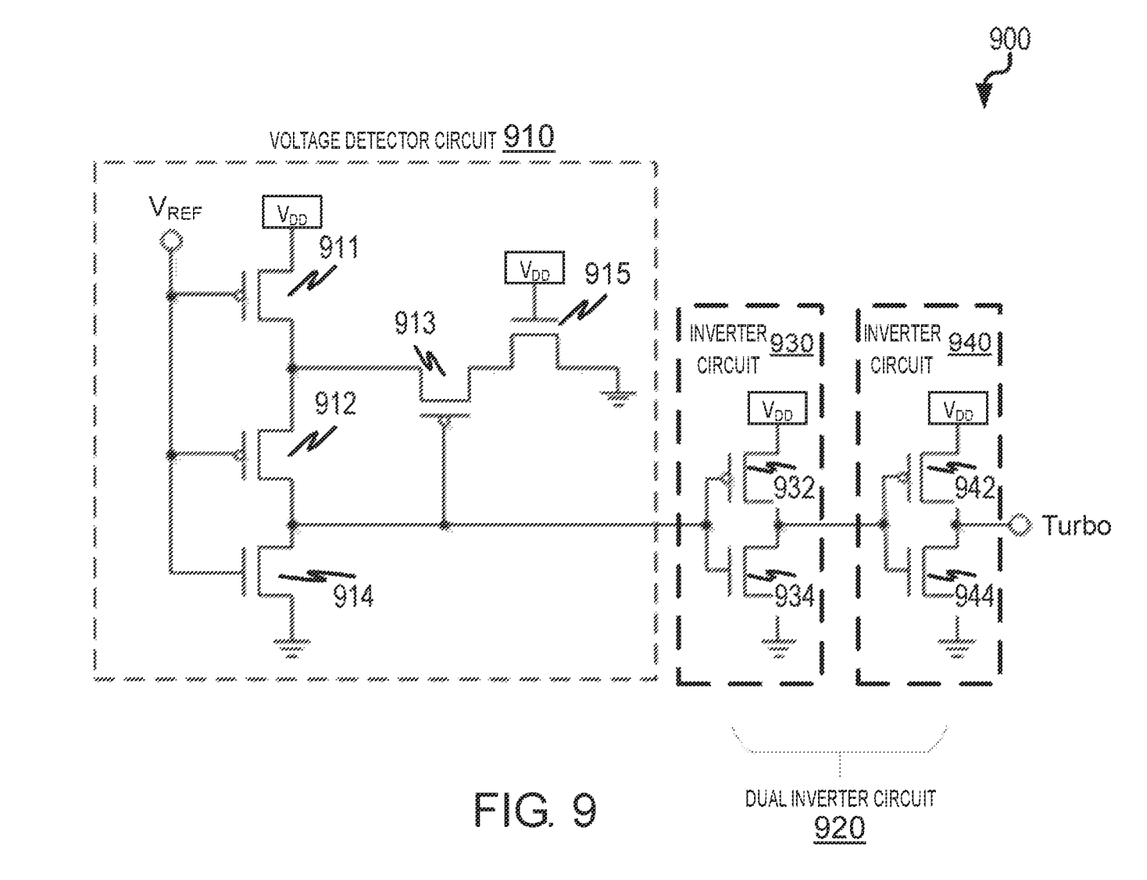
FIG. 9 depicts another example of a turbo enabling circuit for providing a turbo signal using a dual inverter circuit and a voltage detector circuit in accordance with some embodiments.

The turbo signal provided to turbo circuit 230 can, in accordance with some embodiments, be provided manually via an external means such as an operator manually applying a high voltage. The turbo signal, for example, can be a predetermined DC voltage. In accordance with other embodiments, turbo signal can be provided by a turbo enabling circuit 900 as illustrated in FIG. 9. In one embodiment, the turbo enabling circuit 900 is configured to provide a high voltage when an operational voltage $V_{DD}$ is greater than a reference voltage $V_{REF}$. Turbo enabling circuit 900 includes a voltage detector circuit 910 and a dual inverter circuit 920. Dual inverter circuit 920 includes at least two inverter circuits 930, 940 coupled together in series. The output of turbo enabling circuit 900 is a turbo signal which can be used to enable various embodiments of the turbo circuit 230 as described in FIGS. 3-4 and 6-7. As described above in some embodiments, a turbo signal is sent in order to pull down the DBL voltage and triggers the sense amplifier control circuit 220 to send SAE signal to turn on sense amplifier enable circuit 136.

In further detail in one embodiment, turbo mode being active or inactive corresponds to the signal output of turbo enabling circuit 900 that includes a voltage detector circuit 910. The turbo enabling circuit 900, controlled by voltage detector circuit 910, outputs a high signal indicating that the turbo mode is to be active when the operational voltage $V_{DD}$ is greater than a reference voltage $V_{REF}$. The turbo enabling circuit 900 includes a dual inverter circuit 920, such that the output of the turbo enabling circuit 900 mirrors the output of the voltage detector circuit 910. Voltage detector circuit 910 detects when the $V_{DD}$ voltage level is greater than the reference voltage $V_{REF}$ by comparing the voltage level $V_{DD}$ to the reference voltage $V_{REF}$. Specifically when $V_{REF}$ is sufficient to turn nMOS transistor 914 on, the voltage detector 910 provides a low signal indicating that turbo is disabled. When $V_{REF}$ is not sufficiently high to turn nMOS transistor 914 on, the voltage detector 910 provides a comparison of the levels of $V_{DD}$ and $V_{REF}$ based on the threshold voltages of nMOS transistor 915, pMOS transistors 911, 912, 913. For example, pMOS transistors 911 and 912 are selected such that when $V_{DD}$ is greater than $V_{REF}$, pMOS transistors 911, 912 are sufficiently on to provide a high enough voltage at the gate of pMOS transistor 913 to block grounding of the $V_{DD}$ signal transiting pMOS transistor 911. That is, when pMOS transistor 913 is on, the $V_{DD}$ signal traversing pMOS transistor 911 may be grounded through transistors 913, 915. Transistors 911, 912, 913, 914 are further selected such that in some instances a low signal level is output from voltage detector 910 when appropriate (e.g., when $V_{DD}$ is equal to $V_{REF}$).

The output of voltage detector 910 is electrically coupled in series to dual inverter circuit 920. The output of inverter 940 generates the turbo signal for turbo circuit 220. Inverter circuit 930 includes pMOS transistor 932 and nMOS transistor 934. When the output of voltage detector circuit 910 is low, nMOS transistor 934 is off and pMOS transistor 932 is on producing a high output to inverter circuit 940. A high output of inverter circuit 930 is provided to inverter circuit 940. Inverter circuit 940 includes a pMOS transistor 942 and an nMOS transistor 944. With a high input into inverter circuit 940, nMOS transistor 944 is on and pMOS transistor 942 is off producing a low output (e.g., a low turbo signal). With a low turbo signal, turbo circuit 220 is non-operational. Alternatively, when the output of voltage detector 910 is high, the input into inverter circuit 930 is high. With a high input, nMOS transistor 934 is on and pMOS transistor 932 is off, producing a low input to inverter circuit 940. With a low input into inverter circuit 940, nMOS transistor 944 is off and pMOS transistor 942 is on, producing a high output (e.g., a high turbo signal). With a high turbo signal, turbo circuit 220 is operational as described in detail in FIGS. 3-4 and 6-7.

Figure 10:
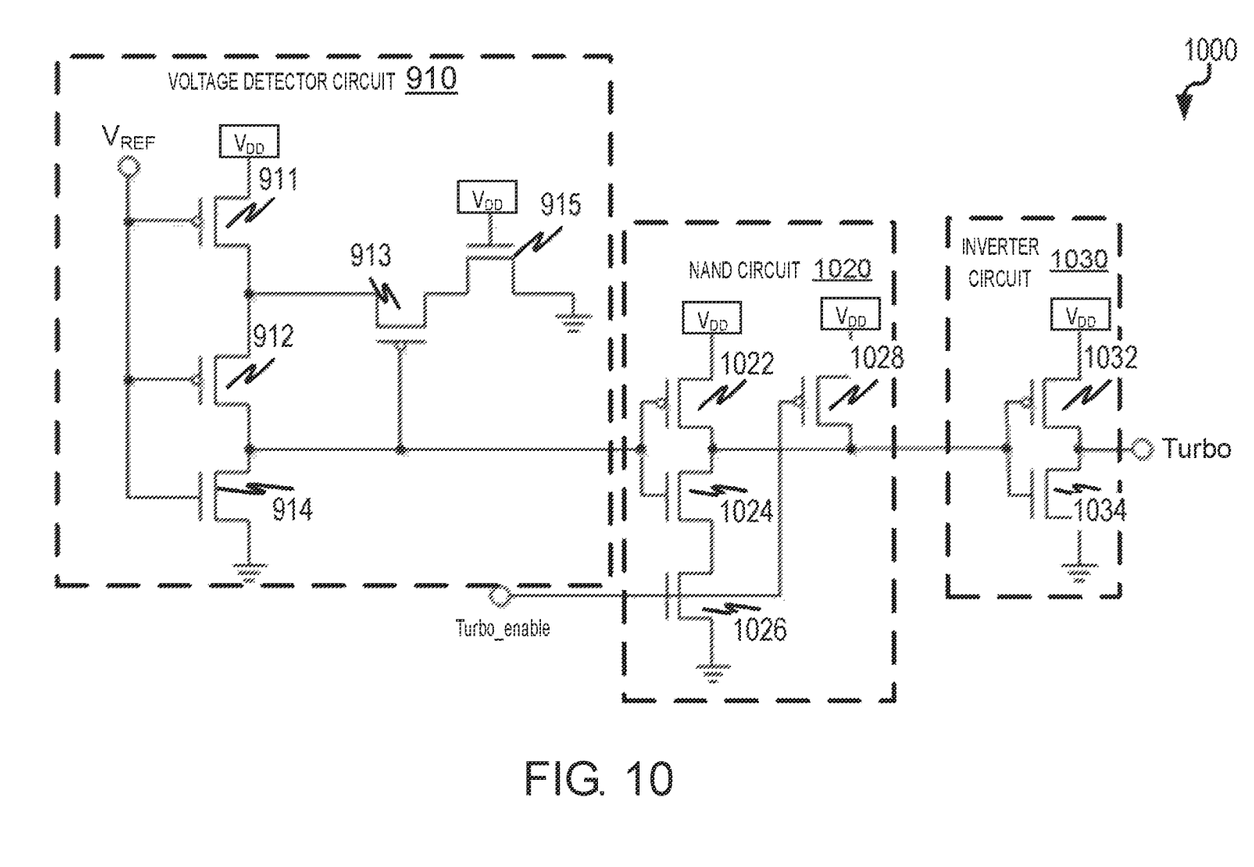
FIG. 10 depicts another example of a turbo enabling circuit for providing a turbo signal using a turbo enable signal and voltage detector circuit in accordance with some embodiments.

FIG. 10 depicts another example of a turbo enabling circuit 1000 for providing a turbo signal using a turbo enable signal and voltage detector circuit 1010 in accordance with some embodiments. With a SoC level implementation as illustrated in FIG. 8, some of the SRAM cells 132 may be unable to utilize the turbo signal. Alternatively, there may be some SRAM cells 132 that do not require turbo signal, due to, for example, operational efficiency of the electrical components within SRAM cell 132. A turbo enable signal can provide for selective application of turbo signal to some of the SRAM cell 132. In accordance with some embodiments, the turbo enabling circuit 1000 includes voltage detector circuit 910, a negative-AND (NAND) circuit 1020, and an inverter circuit 1030. NAND circuit 1020 is a NAND logic gate circuit that includes pMOS transistors 1022, 1028 and nMOS transistors 1024, 1026. NAND circuit 1020 is driven by at least two inputs: the output of the voltage detector circuit 910 and a turbo enable signal Turbo_enable. Turbo enable signal can be applied to NAND circuit for the predetermined SRAM cells 132 that should receive the turbo signal as appropriate.

The turbo signal output of turbo enable circuit 1000 is high (e.g., applies turbo signal to turbo circuit 220) when both of the output of voltage detector circuit 910 and the turbo enable signal Turboe_enable are high. When the output of voltage detector circuit 910 is high and the turbo enable pin is high (e.g., turbo enable signal is applied to NAND circuit 1020), NMOS transistors 1024, 1026 are on and pMOS transistors 1022, 1028 are off. The output of NAND circuit 1020 is low when NMOS transistors 1024, 1026 are on and pMOS transistors 1022, 1028 are off. The output of NAND circuit 1020 is provided to inverter circuit 1030. Inverter circuit 1030 includes pMOS transistor 1032 and nMOS transistor 1034. When the input to inverter circuit 1030 is low, nMOS transistor 1034 is off and pMOS transistor 1032 is on, producing a high output (e.g., a high turbo signal). The turbo signal is applied to turbo circuit 220 as described in FIGS. 3-4 and 6-7.

The output of turbo enable circuit 1000 is low when either one or both of the output of voltage detector circuit 910 and/or the turbo enable signal is low (e.g., no turbo signal or a low signal is applied to turbo circuit 220). When the output voltage of voltage detector 910 is low and the turbo enable signal is low (e.g., not applied), nMOS transistors 1024, 1026 are off and pMOS transistors 1022, 1028 are on. With pMOS transistors 1022, 1028 being on, the output of NAND circuit 1020 is high. When the output voltage of the voltage detector is low and the turbo enable signal is high, pMOS transistor 1022 and nMOS transistor 1026 are on and pMOS transistor 1028 and nMOS transistor 1024 are off, producing a high output of NAND circuit 1020. Similarly, when the output of the voltage detector circuit 810 is high and the turbo enable signal is low, NAND circuit 1020 has a high output. The high output is due to pMOS transistor 1028 and nMOS transistor 1024 being on and pMOS transistor 1022 and nMOS transistor 1026 being off. With a high input to inverter circuit 1030, pMOS transistor 1032 is off and nMOS transistor 1034 is on, producing a low output (e.g., turbo signal). With a low output of inverter circuit 1030, turbo circuit 220 is non-operational.

Figure 11:
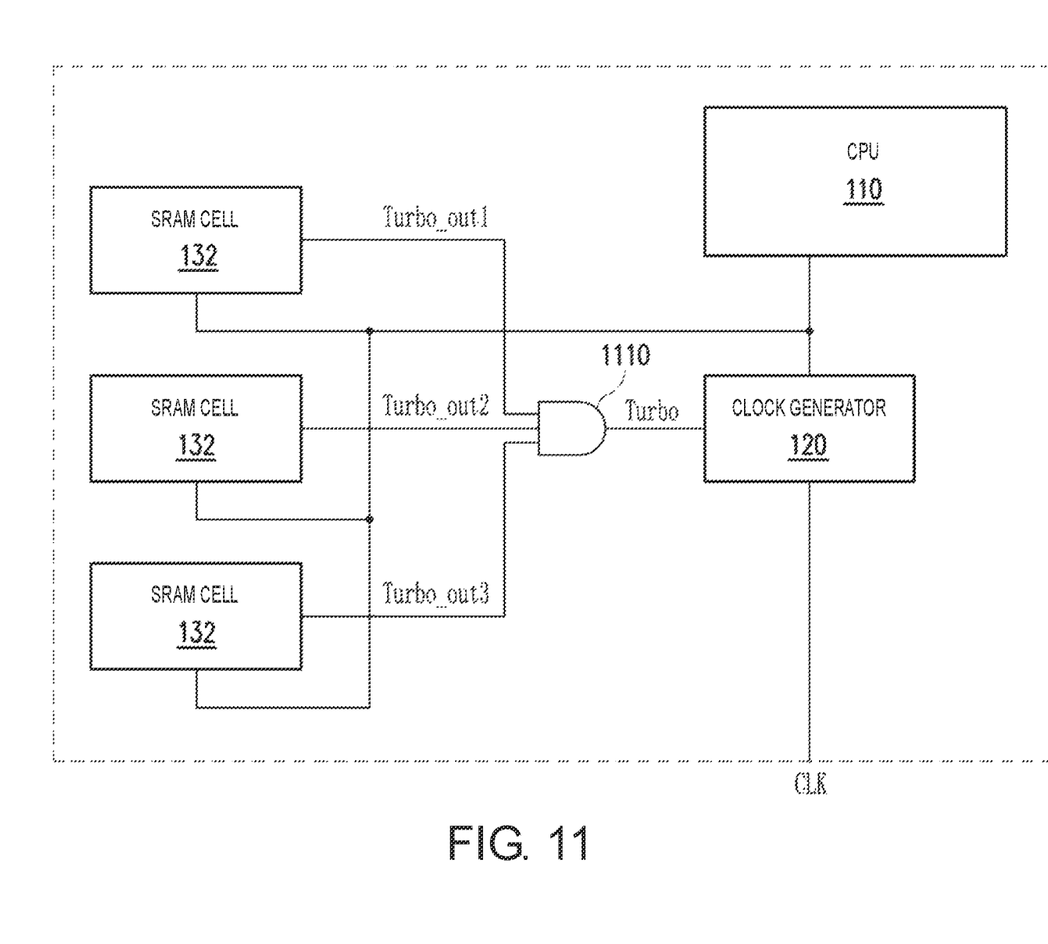
FIG. 11 depicts an example system architecture of SRAM device incorporating turbo mode at a SoC level in accordance with some embodiments.

FIG. 11 depicts an example system architecture incorporating turbo mode at a SoC level in accordance with some embodiments. When the voltage detector circuit 910 is used to enable SRAM cells 132 to enter turbo mode, a handshake signal can identify to the rest of the SoC that the clock frequency generated by clock generator 120 to the SRAM cells 132 should increase. This can be done generating a handshake signal from each of the SRAM cells 132 (e.g., turbo_out1, turbo_out2, turbo_out 3 of FIG. 11). The individual handshake signals can be evaluated using a logic gate 1110 (e.g., AND gate). Based on the output of logic gate 1110, a turbo signal can be provided to clock generator 120 to increase a global clock period and operate SRAM cells 132 at a higher frequency than provided by clock generator 120.

Figure 12:
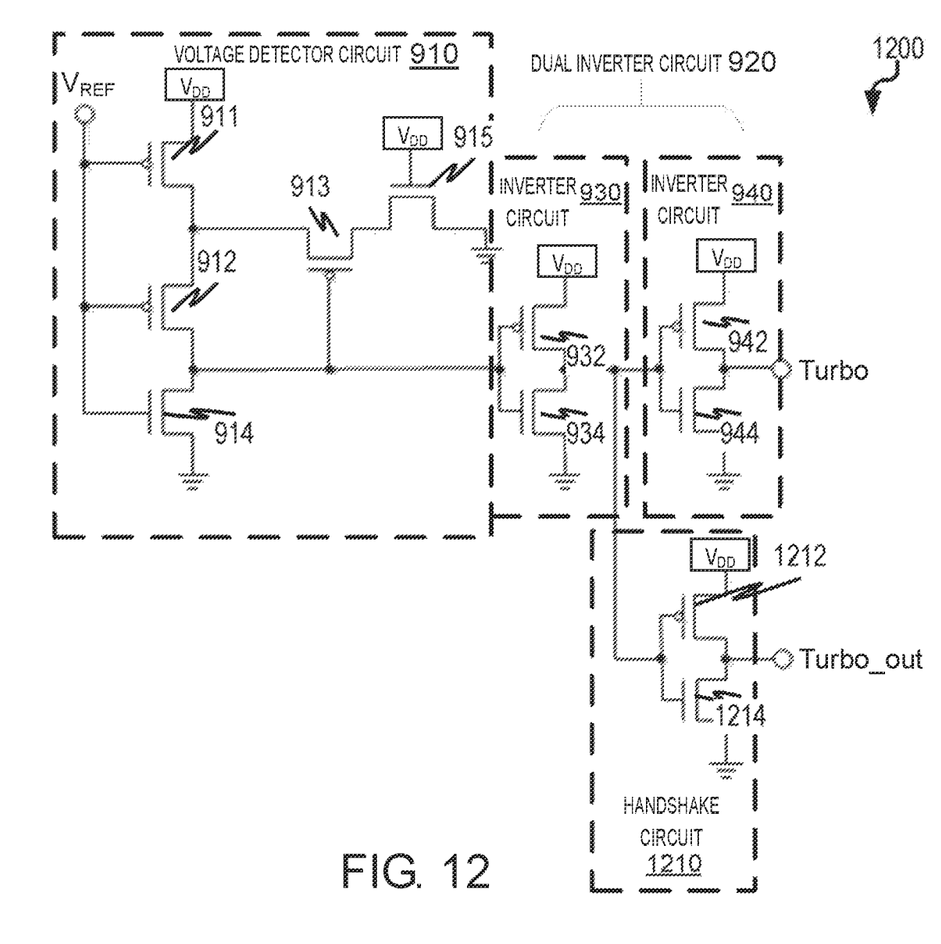
FIG. 12 depicts an example turbo enable circuit with a handshake circuit in accordance with some embodiments.

FIG. 12 depicts an example turbo enable circuit 1200 with a handshake circuit 1210 in accordance with some embodiments. While the circuit described in FIG. 12 is applicable to many different hardware configurations, the circuit is described with reference to structures from FIG. 11 here for ease in understanding. Handshake circuit 1210 can be an inverter circuit that includes pMOS transistor 1212 and nMOS transistor 1214. Similar to inverter circuit 930, when the input to handshake circuit 1210 is low, the output (e.g., turbo_out) is high due to nMOS transistor 1214 being off and pMOS transistor 1212 being on. When the input to handshake circuit 1210 is high, the output (e.g., turbo_out) is low due to nMOS transistor 1214 being on and pMOS transistor 1212 being off. Turbo enable circuit 1200 can be included in the SRAM devices 130. Each turbo enable circuit 1200 can provide at least two outputs: turbo signal and turbo_out signal at the SoC level. The turbo_out signal of turbo enable circuit 1200 can be, for example, the inputs into logic gate 1110 of FIG. 11. As describe in FIG. 11, the logic gate 1110 can control whether the turbo signal is applied at the SoC level based on the handshake signal from each of the one or of the SRAM cells 132.

Use of the various circuits and configuration as described herein can enable turbo mode of SRAM devices. With turbo mode, the SRAM devices can operate at high performance levels as the voltage differential between the weakest SRAM cell of an array and the nominal SRAM cell of an array is minimized. As such, the various embodiments of turbo circuit 220 can be enabled in a plurality of ways to result in an overall increased performance of SRAM devices 130.

In one embodiment, a system includes a cell circuit, a sense amplifier circuit, a tracking circuit, and a turbo circuit. The cell circuit is coupled between a bit line pair configured to perform read or write operations of a memory device. The sense amplifier circuit is coupled between the bit line pair and configured to sense a voltage differential between the bit line pair. The tracking circuit includes a DBL. The tracking circuit is configured to monitor operation of the cell circuit and send a sense amplifier enable signal to the sense amplifier at a predetermined frequency rate based on a voltage level of the DBL. The turbo circuit is coupled to a turbo signal and configured to modify the voltage of the tracking bit line enabling sending of the sense amplifier enable signal at a rate faster than the predetermined frequency rate.

In another embodiment, a turbo signal is injected into a turbo circuit of a SRAM cell. A tracking bit line voltage of the SRAM cell is modified based on the injected turbo signal. A rate of voltage discharge associated with the tracking bit line is increased based on the injected turbo signal.

In yet another embodiment, a memory device includes a DWL, a DBL, a tracking cell circuit coupled between the DWL and the DBL, an inverter circuit coupled to the DBL, and a turbo circuit coupled between the DWL and the DBL. The inverter circuit is configured to operate based on a DBL voltage. The turbo circuit is configured to receive a turbo signal and enable operation of the inverter circuit.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

This written description and the following claims may include terms, such as "on," that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on and in immediate contact with the second layer/structure unless such is specifically stated; there may be third layers/structures between the first layer/structure and the second layer/structure. The term "semiconductor device structure" used herein (including in the claims) may refer to shallow trench isolation features, poly-silicon gates, lightly doped drain regions, doped wells, contacts, vias, metal lines, or other types of circuit patterns or features to be formed on a semiconductor substrate.

What is claimed is:

1. A system comprising:
a sense amplifier circuit coupled between a bit line pair and configured to sense a voltage differential between the bit line pair;
a sense amplifier control circuit configured to send a sense amplifier enable signal to the sense amplifier circuit at a predetermined frequency rate based on a voltage of a tracking bit line (DBL);
a turbo circuit configured to modify the voltage of the DBL enabling sending of the sense amplifier enable signal at a rate faster than the predetermined frequency rate, wherein the turbo circuit is configured to control the voltage of the DBL based upon a turbo signal and a voltage of a tracking word line (DWL);
a turbo enabling circuit configured to generate the turbo signal and including a NAND circuit; and
a tracking cell coupled between the DWL and the DBL, wherein:
the turbo circuit is coupled between the DWL and the DBL;
the tracking cell includes cross-coupled inverters; and
an output of one of the cross-coupled inverters is tied to a supply voltage.

2. The system of claim 1, wherein:
the tracking cell is configured to track or imitate read or write operations at different locations within an array of a memory device;
the sense amplifier enable signal is generated when the voltage of the DBL falls below a threshold voltage; and
the turbo signal decreases the voltage of the DBL voltage.

3. The system of claim 1, wherein the tracking cell is configured to pull-down the voltage of the DBL.

4. The system of claim 1, further comprising:
a voltage detector circuit configured to detect a voltage difference between a supply voltage and a reference voltage; and a dual inverter circuit coupled to the voltage detector circuit configured to generate the turbo signal based on the voltage difference.

5. The system of claim 4, further comprising:
an inverter circuit electrically coupled to the dual inverter circuit and configured to generate a handshake signal; and
a logic gate configured to provide the turbo signal to a clock generator based upon the handshake signal.

6. The system device of claim 1, further comprising:
a voltage detector circuit configured to detect a voltage difference between a supply voltage and a reference voltage, wherein
the NAND circuit is coupled to the voltage detector circuit and a turbo enable input signal; and
an inverter circuit coupled to an output of the NAND circuit, the inverter circuit being configured to generate the turbo signal based on the voltage difference and the turbo enable input signal.

7. The system of claim 1, further comprising a timer transistor gated by the voltage of the tracking word line and the timer transistor is coupled to the turbo circuit.

8. The system of claim 1, wherein the turbo circuit includes a transistor having a gate terminal configured to receive the turbo signal and a source/drain terminal coupled to the DBL.

9. The system of claim 1, wherein the turbo circuit includes a logic gate having a first input terminal configured to receive the turbo signal and a second input terminal coupled to the DBL.

10. A method comprising:
generating a sense amplifier enable signal based on a voltage of a tracking bit line (DBL);
injecting a turbo signal into a turbo circuit;
modifying the voltage of the DBL based on the turbo signal and a voltage of a tracking word line (DWL), wherein:
 a tracking cell is coupled between the DWL and the DBL and includes cross-coupled inverters;
 an output of one of the cross-coupled inverters is coupled to a supply voltage; and
 the turbo circuit is coupled between the DWL and the DBL; and
generating the turbo signal, using a NAND circuit, based on a turbo enable input signal.

11. The method of claim 10, wherein injecting the turbo signal into the turbo circuit decreases the voltage of the DBL and the decreased voltage of the DBL triggers the sense enable signal to enable performance of read or write operations of a memory device.

12. The method of claim 10, wherein the turbo circuit modifies the voltage of the DBL by pulling down the voltage of the DBL using at least two transistors coupled together in series.

13. The method of claim 10, wherein the turbo circuit modifies the voltage of the DBL when the voltage of the DWL and the turbo signal are a logic high.

14. The method of claim 10, further comprising:
detecting, using a voltage detector circuit, a voltage difference between a supply voltage and a reference voltage; and
generating, using a dual inverter circuit coupled to the voltage detector circuit, the turbo signal when the supply voltage exceeds the reference voltage.

15. The method of claim 10, further comprising:
detecting, using a voltage detector circuit, a voltage difference between a supply voltage and a reference voltage; and
generating the turbo signal, using the NAND circuit, based on the supply voltage exceeding the reference voltage and the turbo enable input signal.

16. The method of claim 10, further comprising a timer transistor gated by the voltage of the tracking word line and the timer transistor is coupled to the turbo circuit.

17. A memory device comprising:
a tracking word line (DWL);
a tracking bit line (DBL);
an inverter circuit configured to generate a sense amplifier enable signal based on a voltage of the DBL;
a turbo enabling circuit configured to generate a turbo signal and including a NAND circuit;
a turbo circuit coupled between the DWL and the DBL and configured to control the voltage of the DBL based on the turbo signal and a voltage of the DWL; and
a tracking cell coupled between the DWL and the DBL and includes cross-coupled inverters, wherein an output of one of the cross-coupled inverters is coupled to a supply voltage.

18. The memory device of claim 17, wherein the turbo circuit comprises:
a first transistor having a gate terminal coupled to the turbo signal and a source/drain terminal coupled to the DBL; and
a second transistor having a gate terminal coupled to the DWL and a source/drain terminal coupled to another source/drain terminal of the first transistor.

19. The memory device of claim 17, wherein the turbo signal is generated based on an applied voltage to the inverter circuit exceeding a predetermined reference voltage.

20. The memory device of claim 17, further comprising a timer transistor gated by the voltage of the tracking word line and the timer transistor is coupled to the turbo circuit.

* * * * *